United States Patent
Antunez et al.

(10) Patent No.: US 10,014,423 B2
(45) Date of Patent: Jul. 3, 2018

(54) CHALCOGEN BACK SURFACE FIELD LAYER

(71) Applicant: International Business Machines Corporation, Armonk, NY (US)

(72) Inventors: Priscilla D. Antunez, Tarrytown, NY (US); Bruce A. Ek, Pelham Manor, NY (US); Richard A. Haight, Mahopac, NY (US); Ravin Mankad, Mumbai (IN); Saurabh Singh, Yonkers, NY (US); Teodor K. Todorov, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 4 days.

(21) Appl. No.: 15/281,789

(22) Filed: Sep. 30, 2016

(65) Prior Publication Data
US 2018/0097130 A1  Apr. 5, 2018

(51) Int. Cl.
*H04L 21/00* (2006.01)
*H01L 31/032* (2006.01)
(Continued)

(52) U.S. Cl.
CPC .... *H01L 31/0326* (2013.01); *H01L 31/02167* (2013.01); *H01L 31/022441* (2013.01);
(Continued)

(58) Field of Classification Search
None
See application file for complete search history.

(56) References Cited

U.S. PATENT DOCUMENTS

2010/0275965 A1* 11/2010 Lee ............... H01L 31/02167
  136/244
2012/0061790 A1  3/2012  Ahmed et al.
(Continued)

FOREIGN PATENT DOCUMENTS

CN     103378214 A    10/2013
CN     102769047 B     3/2015
(Continued)

OTHER PUBLICATIONS

Mitzi et al., "Prospects and performance limitations for Cu—Zn—Sn—S—Se photovoltaic technology," Phil Trans R Soc A 371 (Jul. 2013).
(Continued)

*Primary Examiner* — Shaun Campbell
(74) *Attorney, Agent, or Firm* — Vazken Alexanian; Michael J. Chang, LLC

(57) ABSTRACT

Kesterite photovoltaic devices having a back surface field layer are provided. In one aspect, a method of forming a photovoltaic device includes: forming a complete photovoltaic device having a substrate, an electrically conductive layer on the substrate, an absorber layer on the electrically conductive layer, a buffer layer on the absorber layer, and a transparent front contact on the buffer layer; removing the substrate and the electrically conductive layer from the complete photovoltaic device to expose a backside surface of the absorber layer; forming a passivating layer on the backside surface of the absorber layer; and forming a high work function back contact on the passivating layer. A photovoltaic device having a passivating layer is also provided.

15 Claims, 6 Drawing Sheets

(51) Int. Cl.
*H01L 31/072* (2012.01)
*H01L 31/0216* (2014.01)
*H01L 31/18* (2006.01)
*H01L 31/0224* (2006.01)

(52) U.S. Cl.
CPC .... *H01L 31/022466* (2013.01); *H01L 31/072* (2013.01); *H01L 31/1864* (2013.01); *H01L 31/1868* (2013.01); *H01L 31/1884* (2013.01)

(56) References Cited

U.S. PATENT DOCUMENTS

| | | |
|---|---|---|
| 2013/0037110 A1 | 2/2013 | Mitzi et al. |
| 2013/0269764 A1 | 10/2013 | Barkhouse et al. |
| 2013/0276888 A1* | 10/2013 | Munteanu ........... H01L 31/0322 136/264 |
| 2014/0166107 A1* | 6/2014 | Lee .................... H01L 31/0322 136/260 |
| 2015/0228812 A1* | 8/2015 | Tanaka .............. H01L 31/02167 136/256 |
| 2016/0204304 A1* | 7/2016 | Gunawan ........... H01L 31/1896 136/256 |
| 2017/0133545 A1* | 5/2017 | Stoddard ............. H01L 31/1804 |

FOREIGN PATENT DOCUMENTS

| | | |
|---|---|---|
| CN | 102769046 B | 4/2015 |
| CN | 103378214 B | 10/2015 |
| TW | 201344943 A | 11/2013 |
| TW | I462319 B | 11/2014 |

OTHER PUBLICATIONS

Dullweber et al., "Back surface band gap gradings in Cu(In,Ga)Se2 solar cells," Thin Solid Films, vol. 387, 11-13 (May 2001).

English Translation of CN103378214A by Lin Junrong et al., Oct. 30, 2013.

English Translation of CN1033782146 by Lin Junrong et al., Oct. 28, 2015.

English Translation of TW201344943A by Lin Chun-Jung et al., Nov. 1, 2013.

English Translation of TWI462319 B by Lin Chun-Jung et al., Nov. 21, 2014.

English Translation of CN102769046B by Yang Chunlei et al., Apr. 4, 2015.

English Translation of CN102769047B by Luo Hailin et al., Mar. 11, 2015.

\* cited by examiner

CHALCOGEN BACK SURFACE FIELD LAYER

STATEMENT OF GOVERNMENT RIGHTS

This invention was made with Government support under Contract number DE-EE0006334 awarded by Department of Energy. The Government has certain rights in this invention.

FIELD OF THE INVENTION

The present invention relates to kesterite (e.g., CZT(S,Se)) photovoltaic devices and more particularly, to kesterite photovoltaic devices having a chalcogen (e.g., selenium (Se), sulfur (S) and/or tellurium (Te)) back surface field layer.

BACKGROUND OF THE INVENTION

Copper zinc tin sulfo-selenide (CZT(S,Se)) is a non-toxic, earth abundant kesterite material that is used as the light absorbing material for thin film photovoltaic devices. CZT(S,Se) has many advantages relative to other thin film photovoltaic devices but overall the efficiency is a little more than half that of copper indium gallium selenide (CIGSe), cadmium telluride (CdTe), and bulk silicon (Si) photovoltaic devices. The primary reason for this low efficiency is the abundance of bulk defects that arise during fabrication of the CZT(S,Se) material.

To circumvent this efficiency deficit, device simulations have shown that if the absorber thickness is reduced to 1 micrometer ($\mu$m) or below, and a high work function back contact is utilized, then electrostatic field effects can result in higher open circuit voltages (Voc) and hence a higher efficiency CZT(S,Se) device. However, a high degree of electron-hole recombination at the back contact works to lower Voc.

Therefore, improved CZT(S,Se) device configurations and techniques for the fabrication thereof that solve these efficiency and electron-hole recombination challenges would be desirable.

SUMMARY OF THE INVENTION

The present invention provides kesterite photovoltaic devices having a chalcogen (e.g., selenium (Se), sulfur (S) and/or tellurium (Te)) back surface field layer. In one aspect of the invention, a method of forming a photovoltaic device is provided. The method includes: forming a complete photovoltaic device having a substrate, an electrically conductive layer on the substrate, an absorber layer (e.g., a kesterite absorber layer having copper, zinc, tin, and at least one of sulfur and selenium) on the electrically conductive layer, a buffer layer on the absorber layer, and a transparent front contact on the buffer layer; removing the substrate and the electrically conductive layer from the complete photovoltaic device to expose a backside surface of the absorber layer; forming a passivating layer (e.g., a selenium, sulfur, and/or tellurium layer) on the backside surface of the absorber layer; and forming a high work function back contact on the passivating layer.

In another aspect of the invention, a photovoltaic device is provided. The photovoltaic device includes: a high work function back contact; a passivating layer on the high work function back contact, wherein the passivating layer includes a material selected from: pure selenium, pure sulfur, and pure tellurium; an absorber layer (e.g., a kesterite absorber layer having copper, zinc, tin, and at least one of sulfur and selenium) on the passivating layer; a buffer layer on the absorber layer; and a transparent front contact on the buffer layer.

A more complete understanding of the present invention, as well as further features and advantages of the present invention, will be obtained by reference to the following detailed description and drawings.

DETAILED DESCRIPTION OF PREFERRED EMBODIMENTS

As provided above, for CZT(S,Se) absorber-based devices if the absorber thickness is reduced (e.g., to less than or equal to about 1 micrometer ($\mu$m)) and a high work function back contact is used, then electrostatic field effects can result in higher open circuit voltages (Voc) and hence a higher efficiency CZT(S,Se) device. A notable challenge to this approach, however, is that a high degree of electron-hole recombination at the back contact occurs which actually lowers the Voc.

Advantageously, a solution to this electron-hole recombination problem is provided herein where a passivating layer is implemented to reduce the electron-hole recombination. Specifically, according to the present techniques, an intermediate film of a chalcogen such as selenium (Se), sulfur (S) and/or tellurium (Te) is added to the back surface of the device which has been found to result in higher device efficiencies. The term "chalcogen" generally refers to the elements in group 16 of the periodic table. As will be described in detail below, the present techniques involve a unique process by which the substrate and conductive layer are removed (e.g., exfoliated) from a completed device, and replaced with the passivating layer followed by a high work function back contact.

Figure 1:
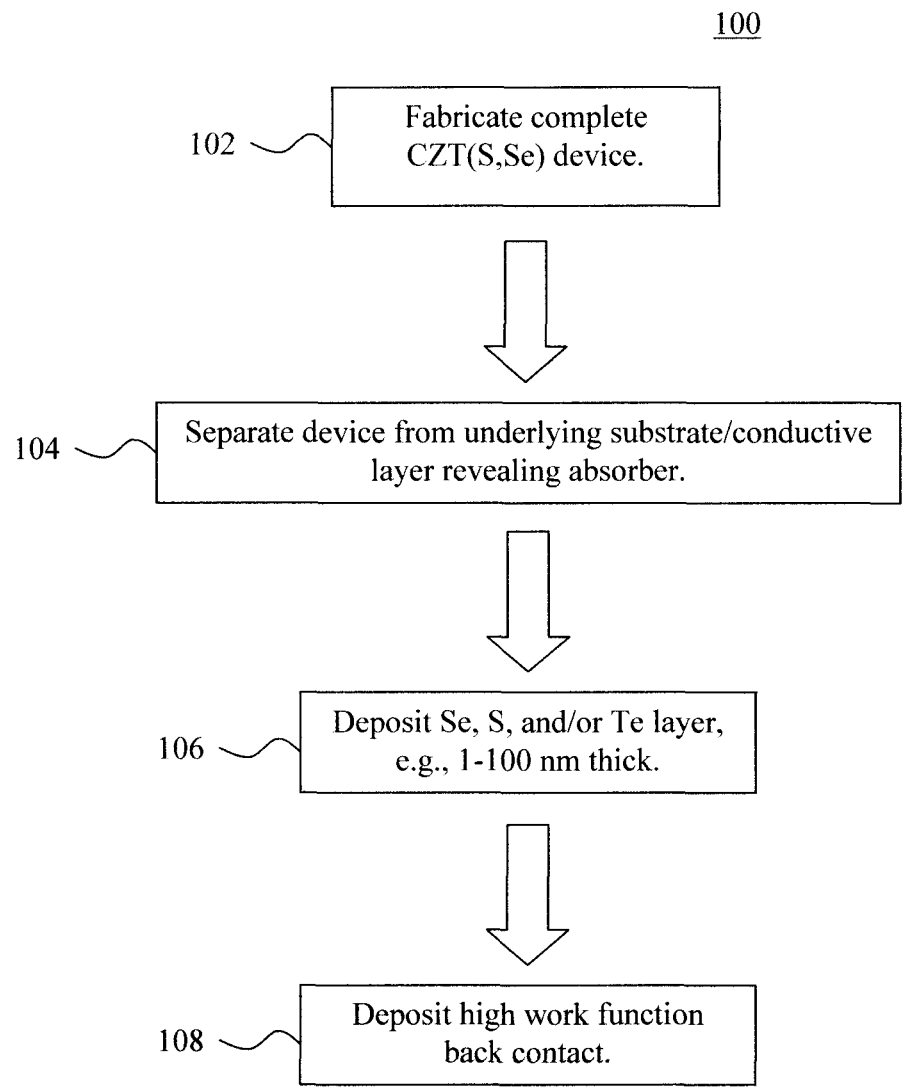
FIG. 1 is a diagram illustrating an exemplary methodology for forming a CZT(S,Se)-based PV device having a Se, S and/or Te backside passivating layer according to an embodiment of the present invention.
Figure 2:
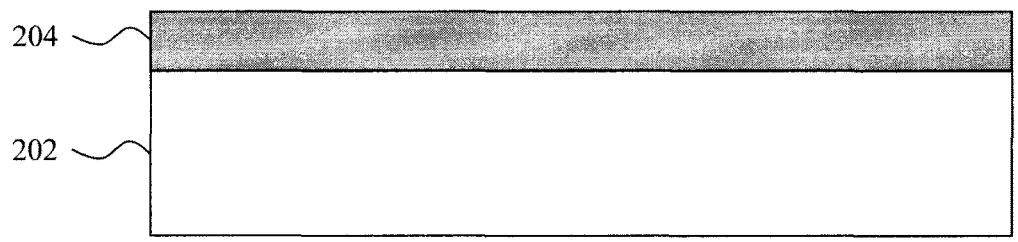
FIG. 2 is a cross-sectional diagram illustrating a substrate having a layer(s) of an electrically conductive material formed thereon according to an embodiment of the present invention.
Figure 3:
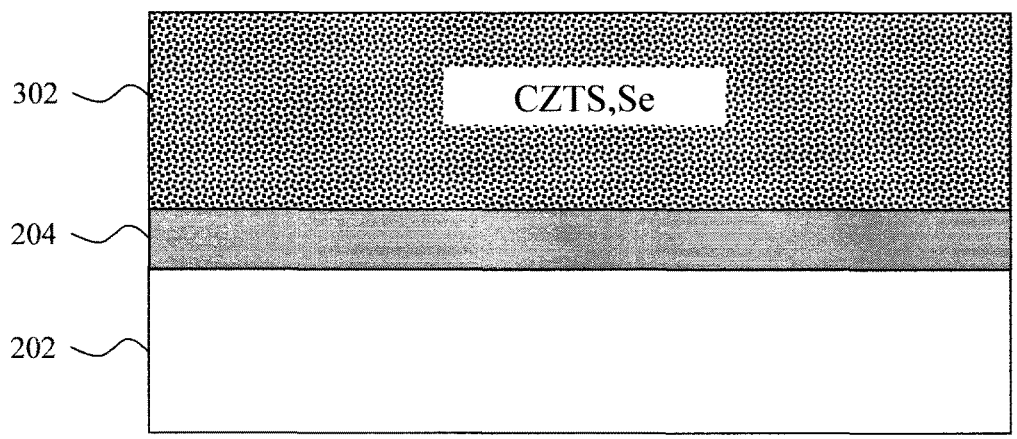
FIG. 3 is a cross-sectional diagram illustrating a CZT(S,Se) absorber layer having been formed on the conductive layer according to an embodiment of the present invention.
Figure 4:
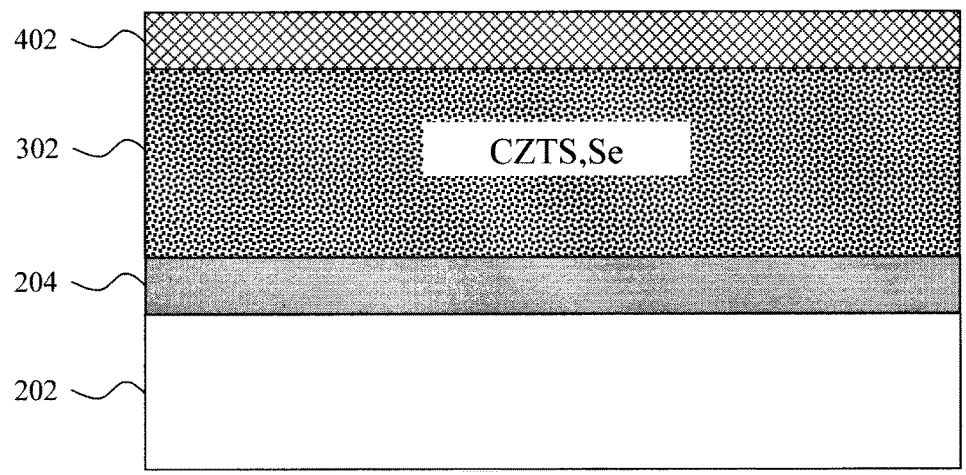
FIG. 4 is a cross-sectional diagram illustrating a buffer layer having been formed on the CZT(S,Se) absorber layer according to an embodiment of the present invention.
Figure 5:
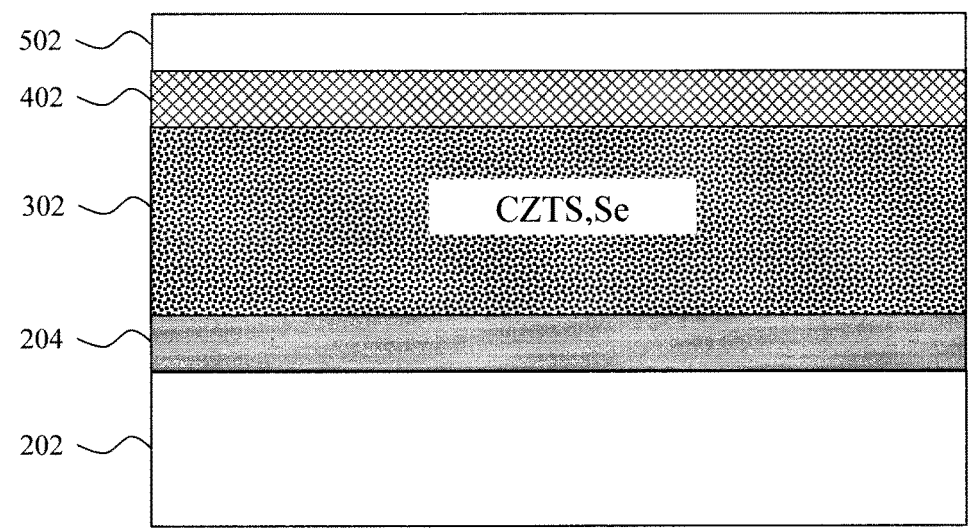
FIG. 5 is a cross-sectional diagram illustrating a transparent front contact having been formed on the buffer layer according to an embodiment of the present invention.
Figure 6:
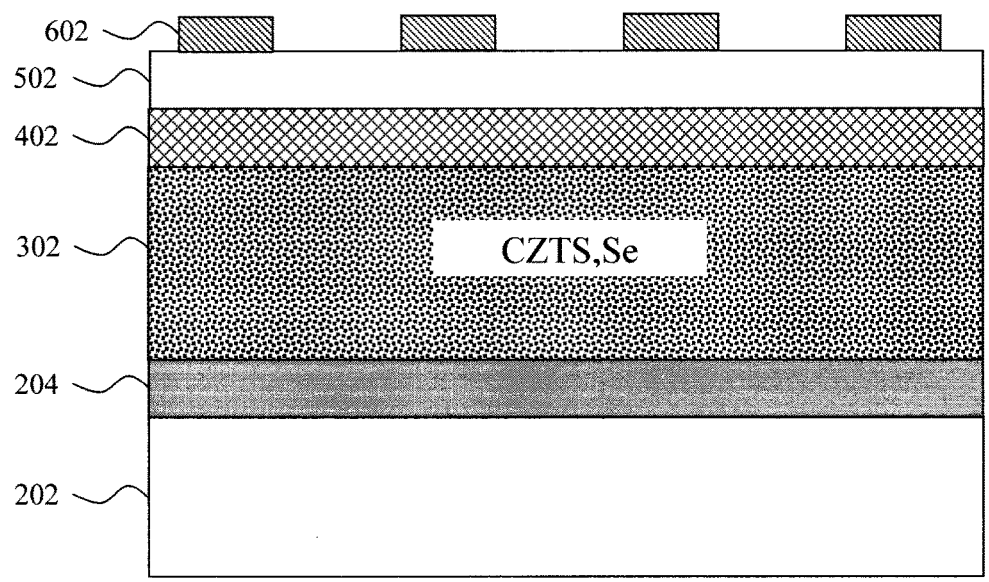
FIG. 6 is a cross-sectional diagram illustrating a metal grid having been formed on the transparent front contact according to an embodiment of the present invention.

The present techniques are now described by way of reference to methodology 100 of FIG. 1, along with reference to FIGS. 2-10. In step 102, a complete CZT(S,Se)-based photovoltaic device is fabricated. By "CZT(S,Se)-based" it is meant that CZT(S,Se) serves as the absorber material of the photovoltaic device. As its name implies, a CZT(S,Se) material contains common, readily available elements namely copper (Cu), zinc (Zn), tin (Sn), and at least one of sulfur (S) and selenium (Se). For a general discussion on kesterites and use of kesterite in solar cells, see, for example, Mitzi et al., "Prospects and performance limitations for Cu—Zn—Sn—S—Se photovoltaic technology," Phil Trans R Soc A 371 (July 2013), the contents of which are incorporated by reference as if fully set forth herein.

By first forming a completed device (and then subsequently replacing the substrate and conductive layer with a passivating layer and high work function back contact—see below) allows for all processes necessary for device fabrication to be carried out before the passivating layer is put in place. For instance, as will be described in detail below, an anneal (preferably in a chalcogen environment) is performed post-deposition of the CZT(S,Se) absorber. By placing the passivating layer at the end of the process, the passivating layer does not experience these anneal conditions, and thus does not undergo intermixing with the CZT(S,Se) absorber. As a result, the passivating layer can remain distinct from the CZT(S,Se) absorber. For instance, according to an exemplary embodiment, the passivating layer is a layer of pure elemental selenium (Se), sulfur (S) and/or tellurium (Te). It is notable that the CZT(S,Se) absorber and/or any layers formed by interaction with the CZT(S,Se) absorber would not contain pure elemental selenium (Se), sulfur (S) and/or tellurium (Te).

According to an exemplary embodiment, the CZT(S,Se)-based photovoltaic device is fabricated in step 102 as follows. The fabrication process begins with a suitable device substrate 202 coated with a layer 204 (or optionally multiple layers represented generically by layer 204) of an electrically conductive material. See FIG. 2.

Suitable substrates include, but are not limited to, glass, ceramic, metal foil, or plastic substrates. Suitable materials for forming conductive layer 204 include, but are not limited to, molybdenum (Mo), molybdenum trioxide ($MoO_3$), gold (Au), nickel (Ni), tantalum (Ta), tungsten (W), aluminum (Al), platinum (Pt), titanium nitride (TiN), silicon nitride (SiN), and combinations including at least one of the foregoing materials (for example as an alloy of one or more of these metals or as a stack of multiple layers such as $MoO_3$+Au). According to an exemplary embodiment, the conductive layer 204 is coated on substrate 202 to a thickness of greater than about 0.1 micrometers ($\mu$m), e.g., from about 0.1 $\mu$m to about 2.5 $\mu$m, and ranges therebetween. In general, the various layers of the device will be deposited sequentially using a combination of vacuum-based and/or solution-based approaches. By way of example only, the electrically conductive material 204 can be deposited onto the substrate 202 using evaporation or sputtering.

Next, a CZT(S,Se) absorber layer 302 is formed on the conductive layer 204. See FIG. 3. As highlighted above, the CZT(S,Se) absorber layer 302 contains Cu, Zn, Sn, and at least one of S and Se. According to an exemplary embodiment, the CZT(S,Se) absorber layer 302 is formed having a total thickness of from about 0.5 micrometers ($\mu$m) to about 2 $\mu$m, and ranges therebetween.

The CZT(S,Se) absorber layer 302 can be formed using vacuum-based, solution-based, or other suitable approaches to form a stack of layers. See for example U.S. Patent Application Publication Number 2012/0061790 by Ahmed et al., entitled "Structure and Method of Fabricating a CZTS Photovoltaic Device by Electrodeposition," the contents of which are incorporated by reference as if fully set forth herein. The sequence of the layers in the stack can be configured to achieve optimal band grading and/or adhesion to the substrate. See, for example, Dullweber et al., "Back surface band gap gradings in Cu(In,Ga)$Se_2$ solar cells," Thin Solid Films, vol. 387, 11-13 (May 2001), the contents of which are incorporated by reference as if fully set forth herein.

Suitable solution-based kesterite fabrication techniques are described, for example, in U.S. Patent Application Publication Number 2013/0037111 by Mitzi et al., entitled "Process for Preparation of Elemental Chalcogen Solutions and Method of Employing Said Solutions in Preparation of Kesterite Films," the contents of which are incorporated by reference as if fully set forth herein. Suitable particle-based precursor approaches for CZT(S,Se) formation are described, for example, in U.S. Patent Application Publication Number 2013/0037110 by Mitzi et al., entitled "Particle-Based Precursor Formation Method and Photovoltaic Device Thereof," the contents of which are incorporated by reference as if fully set forth herein.

Since the as-deposited materials have poor grain structure and a lot of defects, following deposition of the CZT(S,Se) materials a post anneal in a chalcogen environment is preferably performed. An anneal in a chalcogen environment improves the grain structure and defect landscape in the CZT(S,Se) material. According to an exemplary embodiment, the anneal is performed at a temperature of from about 400 degrees Celsius (° C.) to about 800° C., and ranges therebetween.

A buffer layer 402 is then formed on the CZT(S,Se) absorber layer 302. See FIG. 4. The buffer layer 402 forms a p-n junction with the CZT(S,Se) absorber layer 302. According to an exemplary embodiment, the buffer layer 402 is formed having a thickness of from about 100 angstroms (Å) to about 1,000 Å, and ranges therebetween.

Suitable buffer layer materials include, but are not limited to, cadmium sulfide (CdS), a cadmium-zinc-sulfur material of the formula $Cd_{1-x}Zn_xS$ (wherein $0<x\leq1$), indium sulfide ($In_2S_3$), zinc oxide, zinc oxysulfide (e.g., a Zn(O,S) or Zn(O,S,OH) material), and/or aluminum oxide ($Al_2O_3$). According to an exemplary embodiment, the buffer layer 402 is deposited on the CZT(S,Se) absorber layer 302 using standard chemical bath deposition.

A transparent front contact 502 is then formed on the buffer layer 402. See FIG. 5. Suitable transparent front contact materials include, but are not limited to, transparent conductive oxides (TCOs) such as indium-tin-oxide (ITO) and/or aluminum (Al)-doped zinc oxide (ZnO) (AZO)). According to an exemplary embodiment, the transparent front contact 502 is formed on the buffer layer 402 by sputtering.

Optionally, a metal grid 602 can be formed on the transparent front contact 502. See FIG. 6. Suitable materials for forming the metal grid 602 include, but are not limited to, Ni and/or Al. According to an exemplary embodiment, the metal grid 602 is formed on the transparent front contact 502 using evaporation or sputtering. Forming a complete photovoltaic device at the beginning of the process enables steps to be undertaken to produce a high quality device. For instance, building the device on a Mo-coated glass substrate can be beneficial in terms of coefficient of thermal expansion (CTE) matching between the device and the substrate, as well as it permits the formation of beneficial secondary compounds such as $MoS_2$ and/or $MoSe_2$, etc.

Referring back to methodology 100, in step 104 the photovoltaic device including the CZT(S,Se) absorber layer is separated from the underlying substrate and conductive layer. This will expose the backside surface of the CZT(S,Se) absorber layer, which is a side of the CZT(S,Se) absorber layer opposite the buffer layer. According to an exemplary embodiment, step 104 is carried out using an exfoliation process. Exfoliation involves attaching the front of the device to a quartz plate via epoxy adhesive and mechanically removing it from the substrate. The weakest point of the stack is the absorber layer/conductive layer interface where the exfoliation takes place.

Figure 7:
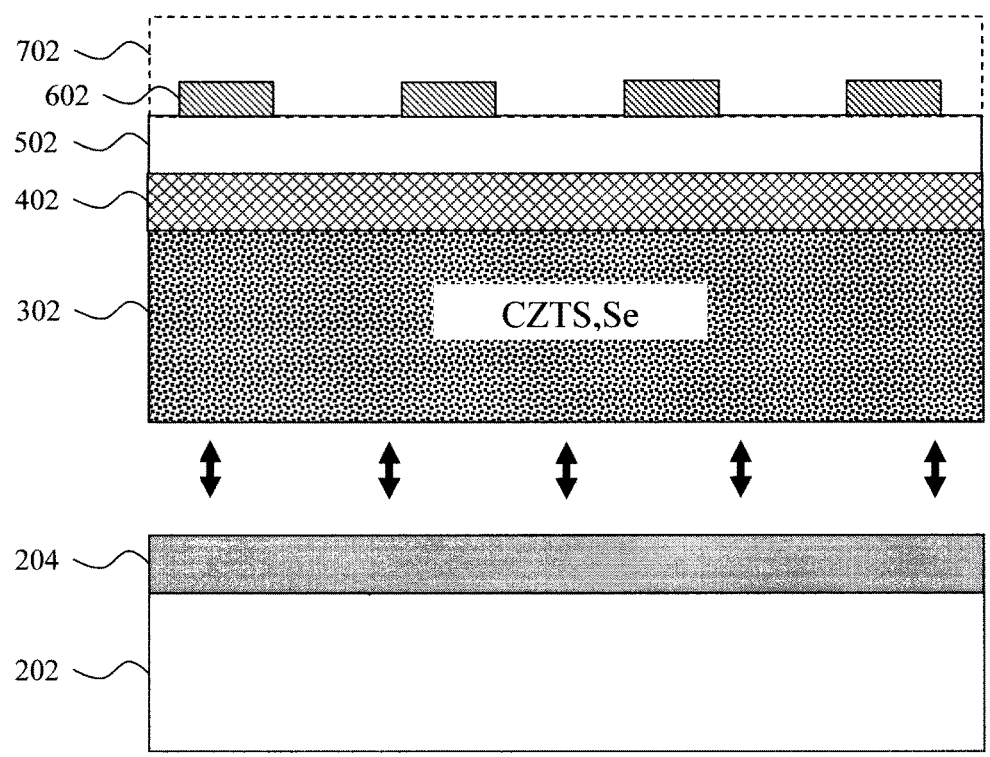
FIG. 7 is a cross-sectional diagram illustrating the CZT(S,Se) absorber layer, the buffer layer, the transparent front contact, and the metal grid having been separated from the conductive layer and substrate according to an embodiment of the present invention.

Step 104 is illustrated schematically in FIG. 7. As shown in FIG. 7, a quartz plate 702 is attached (e.g., epoxied) to the front of the stack (i.e., on the transparent front contact 502 over the metal grid 602) and the CZT(S,Se) absorber layer 302 (and with it the buffer layer 402, the transparent front contact 502, and the metal grid 602) is separated from the conductive layer 204/substrate 202). The backside surface of the CZT(S,Se) absorber layer 302 (i.e., a side of the CZT(S,Se) absorber layer 302 opposite the buffer layer 402) is now exposed. The conductive layer 204/substrate 202 can be discarded or used in the production of additional devices. The quartz plate 702 can remain in place or, as shown in the figures, be removed following exfoliation.

Referring back to methodology 100, in step 106 a passivating layer is next deposited onto the (now-exposed) backside surface of the CZT(S,Se) absorber layer. According to an exemplary embodiment, the passivating layer includes Se, S, and/or Te and is formed on the backside surface of the CZT(S,Se) absorber layer to a thickness of from about 1 nanometer (nm) to about 100 nm, and ranges therebetween. As highlighted above, the passivating layer serves to passivate or suppress electron-hole recombination at the high workfunction back contact (to be formed as per step 108—described below) which enhances device efficiency. By way of example only, the passivating layer can be deposited onto the backside surface of the CZT(S,Se) absorber layer using evaporation or sputtering.

As described above, by placing the passivating layer at the end of the process, the passivating layer does not experience the high temperature annealing conditions associated with the absorber fabrication, and thus the passivating layer does not intermix with the CZT(S,Se) absorber. As a result, the passivating layer remains as a separate layer from the CZT(S,Se) absorber having a distinct composition, e.g., according to an exemplary embodiment the passivating layer is a layer of pure elemental Se, S and/or Te.

Figure 8:
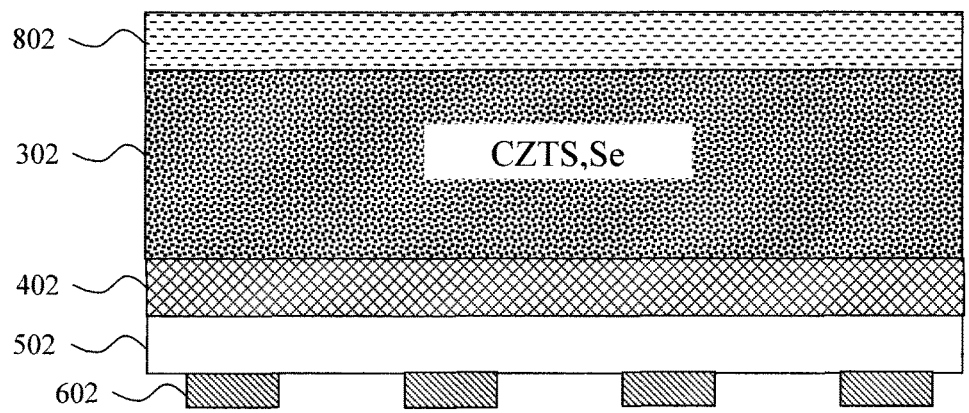
FIG. 8 is a cross-sectional diagram illustrating a passivating layer having been formed on the backside surface of the CZT(S,Se) absorber layer according to an embodiment of the present invention.

Step 106 is illustrated schematically in FIG. 8. As shown in FIG. 8, the conductive layer 204/substrate 202 have been taken away (e.g., and discarded or re-used). The remaining device structure is also shown flipped such that the backside surface of the CZT(S,Se) absorber layer is now on top. This flipping is done for ease of manufacture such that the additional device layers (i.e., passivating layer, high workfunction back contact, etc.) can be formed sequentially, one on top of the other. As shown in FIG. 8, a passivating layer 802 (including, e.g., Se, S, and/or Te) has been formed on the backside surface of the CZT(S,Se) absorber layer 302.

Referring back to methodology 100, in step 108 a high work function (e.g., above 4.5 electron volts (eV)) back contact is formed on the passivating layer. Suitable materials for the high work function back contact include, but are not limited to, Mo, $MoO_3$, Au, Ni, Ta, W, Al, Pt, TiN, SiN, and combinations thereof. For instance, according to an exemplary embodiment, the high work function back contact is formed from $MoO_3$+Au.

Figure 9:
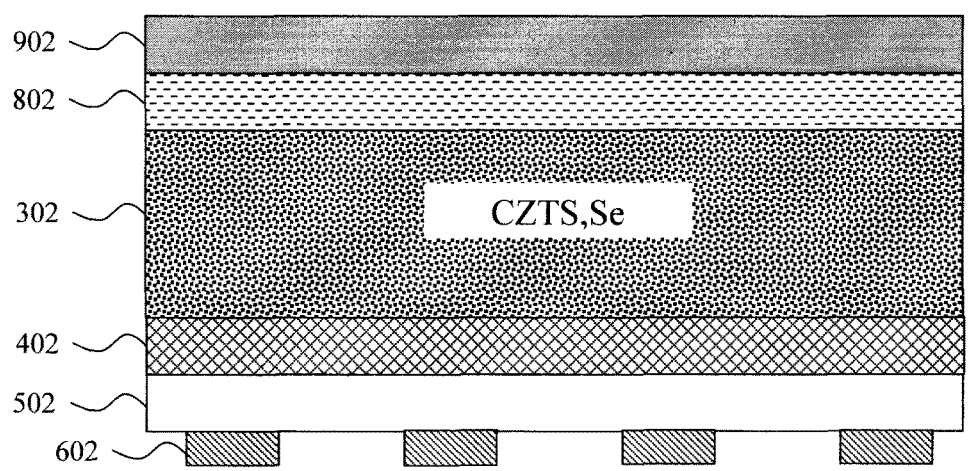
FIG. 9 is a cross-sectional diagram illustrating a high work function back contact having been formed on the passivating layer according to an embodiment of the present invention.

Step 108 is illustrated schematically in FIG. 9. As shown in FIG. 9, a high work function back contact 902 is formed on the passivating layer 802. The high work function back contact 902 is separated from the CZT(S,Se) absorber layer 302 by the passivating layer 802. The passivating layer 802 serves to passivate or suppress electron-hole interface recombination at the high work function back contact 902 which enhances device efficiency as is illustrated in the examples provided below. Electron-hole recombination at the interface between the high work function back contact 902 and the CZT(S,Se) absorber layer 302 is suppressed by inclusion of the higher band gap surface field material (i.e., the passivating layer 802) at that interface.

Figure 10:
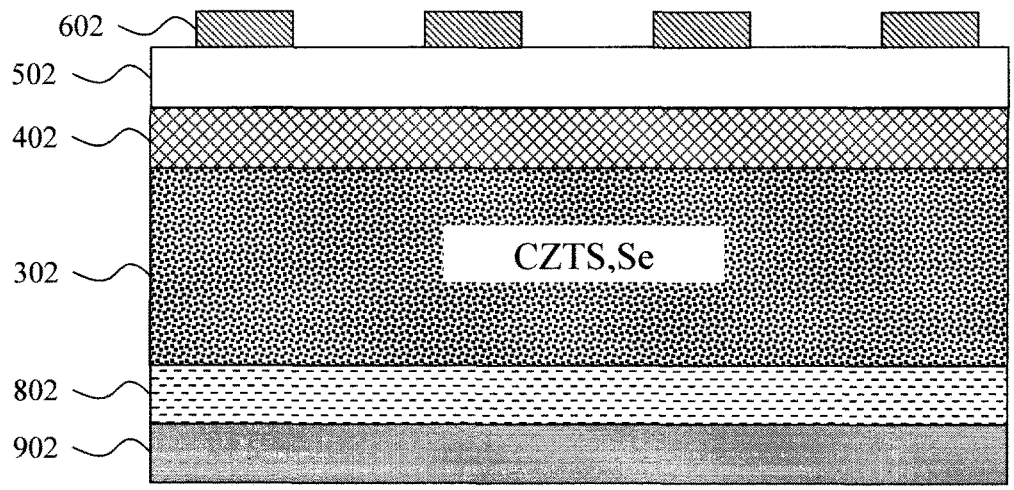
FIG. 10 is a cross-sectional diagram illustrating the completed CZT(S,Se)-based photovoltaic device according to an embodiment of the present invention.

The completed CZT(S,Se)-based photovoltaic device is shown in FIG. 10. The depiction provided in FIG. 10 has the device turned right-side up, with the high work function back contact 902 at the bottom. As shown in FIG. 10, the high work function back contact 902 is separated from the CZT(S,Se) absorber layer 302 by the passivating layer 802. Specifically, the CZT(S,Se)-based photovoltaic device as shown in FIG. 10 includes high work function back contact 902, passivating layer 802 on the high work function back contact 902, CZT(S,Se) absorber layer 302 on the passivating layer 802, buffer layer 402 on the CZT(S,Se) absorber layer 302, transparent front contact 502 on the buffer layer 402, and metal grid 602 on the transparent front contact 502.

Figure 11:
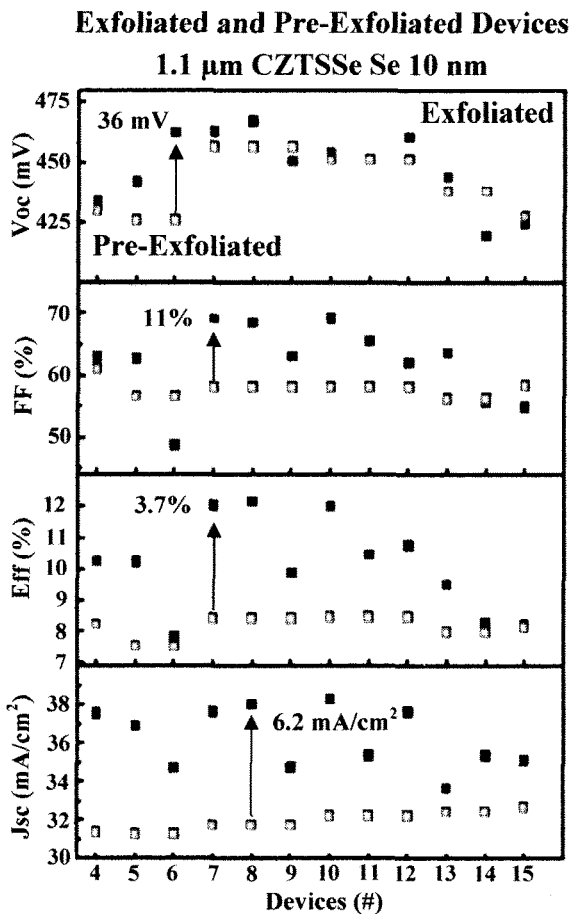
FIG. 11 is a diagram illustrating performance of exemplary devices prepared according to the present techniques according to an embodiment of the present invention.

The present techniques are now described in further detail by way of reference to the following non-limiting device examples shown in FIG. 11. The data in FIG. 11 shows the results from a control pre-exfoliated CZT(S,Se) device (open boxes) for a 1.1 μm thick CZT(S,Se) absorber layer.

Before the addition of a 10 nm Se (passivating) layer the highest device efficiencies were less than 9 percent (%). Incorporation of a pure Se passivating layer, lead to up to a 36 millivolt (mV) increase in open circuit voltage (Voc), up to an 11% increase in fill factor (FF), up to 6 milliamps per square centimeter ($mA/cm^2$) in short circuit current, and an absolute 3.7% increase in efficiency. The results in FIG. 11 are shown for 15 different devices. Notably device #8 had an efficiency of 12.2%, a 68.5% FF, a Voc of 467 mV, and a short circuit current of 38 $mA/cm^2$. See FIG. 11.

Although illustrative embodiments of the present invention have been described herein, it is to be understood that the invention is not limited to those precise embodiments, and that various other changes and modifications may be made by one skilled in the art without departing from the scope of the invention.

What is claimed is:
1. A method of forming a photovoltaic device, the method comprising:
   forming a complete photovoltaic device having a substrate, an electrically conductive layer on the substrate, an absorber layer on the electrically conductive layer, a buffer layer on the absorber layer, and a transparent front contact on the buffer layer;

removing the substrate and the electrically conductive layer from the complete photovoltaic device to expose a backside surface of the absorber layer;

forming a passivating layer on the backside surface of the absorber layer, wherein the passivating layer comprises a material selected from the group consisting of: pure selenium, pure sulfur, and pure tellurium; and forming a high work function back contact on the passivating layer.

2. The method of claim 1, wherein the substrate is selected from the group consisting of: a glass substrate, a ceramic substrate, a metal foil substrate, and a plastic substrate.

3. The method of claim 1, wherein the electrically conductive layer comprises a material selected from the group consisting of: molybdenum, molybdenum trioxide, gold, nickel, tantalum, tungsten, aluminum, platinum, titanium nitride, silicon nitride, and combinations thereof.

4. The method of claim 1, wherein the absorber layer comprises a kesterite material.

5. The method of claim 4, wherein the absorber layer comprises copper, zinc, tin, and at least one of sulfur and selenium.

6. The method of claim 1, wherein the absorber layer has a thickness of from about 0.5 micrometers to about 2 micrometers, and ranges therebetween.

7. The method of claim 1, wherein the buffer layer comprises a material selected from the group consisting of: cadmium sulfide, cadmium-zinc-sulfur, indium sulfide, zinc oxide, zinc oxysulfide, aluminum oxide, and combinations thereof.

8. The method of claim 1, wherein the transparent front contact comprises a transparent conductive oxide selected from the group consisting of: indium-tin-oxide, aluminum-doped zinc oxide, and combinations thereof.

9. The method of claim 1, wherein the substrate and the electrically conductive layer are removed from the complete photovoltaic device using exfoliation.

10. The method of claim 1, wherein the high work function back contact comprises a material selected from the group consisting of: molybdenum, molybdenum trioxide, gold, nickel, tantalum, tungsten, aluminum, platinum, titanium nitride, silicon nitride, and combinations thereof.

11. The method of claim 1, wherein the high work function back contact comprises molybdenum trioxide and gold.

12. The method of claim 1, wherein the forming of the complete photovoltaic device further comprises:

forming a metal grid on the transparent front contact.

13. The method of claim 1, wherein the metal grid comprises a material selected from the group consisting of: nickel, aluminum, and combinations thereof.

14. The method of claim 1, wherein the forming of the complete photovoltaic device comprises:

forming the electrically conductive layer on the substrate;

forming the absorber layer on the electrically conductive layer;

annealing the absorber layer;

forming the buffer layer on the absorber layer; and forming the transparent front contact on the buffer layer.

15. The method of claim 14, wherein the absorber layer is annealed at a temperature of from about 400° C. to about 800° C., and ranges therebetween.

* * * * *